United States Patent
Pierce et al.

(10) Patent No.: US 12,050,241 B2
(45) Date of Patent: Jul. 30, 2024

(54) POWER LINE SENSORS WITH AUTOMATIC PHASE IDENTIFICATION

(71) Applicant: Sentient Technology Holdings, LLC, Wichita, KS (US)

(72) Inventors: William Ed Pierce, Menlo Park, CA (US); Nasahn Frank Reader, Burlingame, CA (US)

(73) Assignee: SENTIENT TECHNOLOGY HOLDINGS, LLC., Wichita, KS (US)

(*) Notice: Subject to any disclaimer, the term of this patent is extended or adjusted under 35 U.S.C. 154(b) by 41 days.

(21) Appl. No.: 16/653,583

(22) Filed: Oct. 15, 2019

(65) Prior Publication Data

US 2020/0116772 A1    Apr. 16, 2020

Related U.S. Application Data

(60) Provisional application No. 62/745,877, filed on Oct. 15, 2018.

(51) Int. Cl.
*G01R 29/18*    (2006.01)

(52) U.S. Cl.
CPC .................. *G01R 29/18* (2013.01)

(58) Field of Classification Search
None
See application file for complete search history.

(56) References Cited

U.S. PATENT DOCUMENTS

| | | |
|---|---|---|
| 3,075,166 A | 1/1963 | Peek |
| 3,558,984 A | 1/1971 | Smith et al. |
| 3,676,740 A | 7/1972 | Schweitzer, Jr. |
| 3,686,531 A | 8/1972 | Decker et al. |
| 3,702,966 A | 11/1972 | Schweitzer, Jr. |
| 3,708,724 A | 1/1973 | Schweitzer, Jr. |
| 3,715,742 A | 2/1973 | Schweitzer, Jr. |
| 3,720,872 A | 3/1973 | Russell et al. |
| 3,725,832 A | 4/1973 | Schweitzer, Jr. |
| 3,755,714 A | 8/1973 | Link |
| 3,768,011 A | 10/1973 | Swain |

(Continued)

FOREIGN PATENT DOCUMENTS

| | | |
|---|---|---|
| EP | 1508146 A | 2/2005 |
| EP | 1938159 A | 7/2008 |

(Continued)

OTHER PUBLICATIONS

Espacenet WO2018027180A1 Phase Identification in Power Distribution Systems, Feb. 8, 2018 (Year: 2018).*

(Continued)

*Primary Examiner* — Michael J Dalbo
*Assistant Examiner* — Denise R Karavias
(74) *Attorney, Agent, or Firm* — Perilla Knox & Hildebrandt LLP; Thomas B. Hildebrandt

(57) ABSTRACT

A monitoring system is provided for identifying conductor phase on power distribution lines using electric field sensors and a remote server. The system includes a plurality of monitoring devices configured to attach to individual conductors on a power grid distribution network. The novel aspects of this system allow the use of noisy, biased, and intermittently available sensors. In particular, the system eliminates the need for dedicated reference stations.

22 Claims, 3 Drawing Sheets

(56) References Cited

U.S. PATENT DOCUMENTS

| | | | |
|---|---|---|---|
| 3,777,217 A | 12/1973 | Groce et al. | |
| 3,814,831 A | 6/1974 | Olsen | |
| 3,816,816 A | 6/1974 | Schweitzer, Jr. | |
| 3,866,197 A | 2/1975 | Schweitzer, Jr. | |
| 3,876,911 A | 4/1975 | Schweitzer, Jr. | |
| 3,957,329 A | 5/1976 | McConnell | |
| 3,970,898 A | 7/1976 | Baumann et al. | |
| 4,063,161 A | 12/1977 | Pardis | |
| 4,152,643 A | 5/1979 | Schweitzer, Jr. | |
| 4,339,792 A | 7/1982 | Yasumura et al. | |
| 4,378,525 A | 3/1983 | Burdick | |
| 4,396,794 A | 8/1983 | Stiller | |
| 4,396,968 A | 8/1983 | Stiller | |
| 4,398,057 A | 8/1983 | Shankle et al. | |
| 4,408,155 A | 10/1983 | McBride | |
| 4,466,071 A | 8/1984 | Russell, Jr. | |
| 4,559,491 A | 12/1985 | Saha | |
| 4,570,231 A | 2/1986 | Bunch | |
| 4,584,523 A | 4/1986 | Elabd | |
| 4,649,457 A | 3/1987 | Talbot et al. | |
| 4,654,573 A | 3/1987 | Rough et al. | |
| 4,661,769 A * | 4/1987 | Girgis | G01R 23/02 324/76.42 |
| 4,709,339 A | 11/1987 | Fernandes | |
| 4,714,893 A | 12/1987 | Smith-Vaniz et al. | |
| 4,723,220 A | 2/1988 | Smith-Vaniz | |
| 4,728,887 A | 3/1988 | Davis | |
| 4,746,241 A | 5/1988 | Burbank | |
| 4,766,549 A | 8/1988 | Schweitzer, III et al. | |
| 4,775,839 A | 10/1988 | Kosina et al. | |
| 4,808,916 A | 2/1989 | Smith Vaniz | |
| 4,829,298 A | 5/1989 | Fernandes | |
| 4,881,028 A | 11/1989 | Bright | |
| 4,886,980 A | 12/1989 | Fernandes et al. | |
| 4,904,932 A | 2/1990 | Schweitzer, Jr. | |
| 4,937,769 A | 6/1990 | Verbanets | |
| 5,006,846 A | 4/1991 | Granville et al. | |
| 5,125,738 A | 6/1992 | Kawamura et al. | |
| 5,138,265 A | 8/1992 | Kawamura et al. | |
| 5,159,561 A | 10/1992 | Watanabe et al. | |
| 5,181,026 A | 1/1993 | Granville | |
| 5,182,547 A | 1/1993 | Griffith | |
| 5,202,812 A | 4/1993 | Shinoda et al. | |
| 5,206,595 A | 4/1993 | Wiggins et al. | |
| 5,220,311 A | 6/1993 | Schweitzer, Jr. | |
| 5,428,549 A | 6/1995 | Chen | |
| 5,438,256 A | 8/1995 | Thuries et al. | |
| 5,473,244 A | 12/1995 | Libove et al. | |
| 5,495,169 A | 2/1996 | Smith | |
| 5,550,476 A | 8/1996 | Lau et al. | |
| 5,565,783 A | 10/1996 | Lau et al. | |
| 5,600,248 A | 2/1997 | Westrom et al. | |
| 5,608,328 A | 3/1997 | Sanderson | |
| 5,650,728 A | 7/1997 | Rhein et al. | |
| 5,656,931 A | 8/1997 | Lau et al. | |
| 5,682,100 A | 10/1997 | Rossi et al. | |
| 5,696,788 A | 12/1997 | Choi et al. | |
| 5,712,796 A | 1/1998 | Ohura et al. | |
| 5,729,144 A | 3/1998 | Cummins | |
| 5,737,203 A | 4/1998 | Barrett | |
| 5,764,065 A | 6/1998 | Richards et al. | |
| 5,839,093 A | 11/1998 | Novosel et al. | |
| 5,892,430 A | 4/1999 | Wiesman et al. | |
| 5,905,646 A | 5/1999 | Crewson et al. | |
| 5,990,674 A | 11/1999 | Schweitzer, Jr. | |
| 6,002,260 A | 12/1999 | Lau et al. | |
| 6,016,105 A | 1/2000 | Schweitzer, Jr. | |
| 6,043,433 A | 3/2000 | Schweitzer, Jr. | |
| 6,133,723 A | 10/2000 | Feight | |
| 6,133,724 A | 10/2000 | Schweitzer, Jr. et al. | |
| 6,212,446 B1 * | 4/2001 | Sato | H02J 3/40 700/292 |
| 6,288,632 B1 | 9/2001 | Hoctor et al. | |
| 6,292,340 B1 | 9/2001 | O'Regan et al. | |
| 6,347,027 B1 | 2/2002 | Nelson et al. | |
| 6,433,698 B1 | 8/2002 | Schweitzer, Jr. et al. | |
| 6,459,998 B1 | 10/2002 | Hoffman | |
| 6,466,030 B2 | 10/2002 | Hu et al. | |
| 6,466,031 B1 | 10/2002 | Hu et al. | |
| 6,477,475 B1 | 11/2002 | Takaoka et al. | |
| 6,483,435 B2 | 11/2002 | Saha et al. | |
| 6,549,880 B1 | 4/2003 | Willoughby et al. | |
| 6,559,651 B1 | 5/2003 | Crick | |
| 6,566,854 B1 | 5/2003 | Hagmann et al. | |
| 6,577,108 B2 | 6/2003 | Hubert et al. | |
| 6,601,001 B1 | 7/2003 | Moore | |
| 6,622,285 B1 | 9/2003 | Rust et al. | |
| 6,677,743 B1 | 1/2004 | Coolidge et al. | |
| 6,718,271 B1 | 4/2004 | Tobin | |
| 6,734,662 B1 | 5/2004 | Fenske | |
| 6,798,211 B1 | 9/2004 | Rockwell et al. | |
| 6,822,457 B2 | 11/2004 | Borchert et al. | |
| 6,822,576 B1 | 11/2004 | Feight et al. | |
| 6,879,917 B2 | 4/2005 | Turner | |
| 6,894,478 B1 | 5/2005 | Fenske | |
| 6,914,763 B2 | 7/2005 | Reedy | |
| 6,917,888 B2 | 7/2005 | Logvinov et al. | |
| 6,927,672 B2 | 8/2005 | Zalitsky et al. | |
| 6,949,921 B1 | 9/2005 | Feight et al. | |
| 6,963,197 B1 | 11/2005 | Feight et al. | |
| 6,980,090 B2 | 12/2005 | Mollenkopf | |
| 7,023,691 B1 | 4/2006 | Feight et al. | |
| 7,046,124 B2 | 5/2006 | Cope et al. | |
| 7,053,601 B1 | 5/2006 | Fenske et al. | |
| 7,072,163 B2 | 7/2006 | McCollough, Jr. | |
| 7,076,378 B1 | 7/2006 | Huebner | |
| 7,085,659 B2 | 8/2006 | Peterson et al. | |
| 7,106,048 B1 | 9/2006 | Feight et al. | |
| 7,158,012 B2 | 1/2007 | Wiesman et al. | |
| 7,187,275 B2 | 3/2007 | McCollough, Jr. | |
| 7,203,622 B2 | 4/2007 | Pan et al. | |
| 7,272,516 B2 | 9/2007 | Wang et al. | |
| 7,295,133 B1 | 11/2007 | McCollough, Jr. | |
| 7,400,150 B2 | 7/2008 | Cannon | |
| 7,424,400 B2 | 9/2008 | McCormack et al. | |
| 7,449,991 B2 | 11/2008 | Mollenkopf | |
| 7,450,000 B2 | 11/2008 | Gidge et al. | |
| 7,508,638 B2 | 3/2009 | Hooper | |
| 7,518,529 B2 | 4/2009 | O'Sullivan et al. | |
| 7,532,012 B2 | 5/2009 | Cern | |
| 7,557,563 B2 | 7/2009 | Gunn et al. | |
| 7,626,794 B2 | 12/2009 | Swartzendruber et al. | |
| 7,633,262 B2 | 12/2009 | Lindsey et al. | |
| 7,638,760 B1 * | 12/2009 | Heipp | H04N 5/3205 250/252.1 |
| 7,672,812 B2 | 3/2010 | Stoupis et al. | |
| 7,683,798 B2 | 3/2010 | Rostron | |
| 7,701,356 B2 | 4/2010 | Curt et al. | |
| 7,714,592 B2 | 5/2010 | Radtke et al. | |
| 7,720,619 B2 | 5/2010 | Hou | |
| 7,725,295 B2 | 5/2010 | Stoupis et al. | |
| 7,742,393 B2 | 6/2010 | Bonicatto et al. | |
| 7,764,943 B2 | 7/2010 | Radtke | |
| 7,795,877 B2 | 9/2010 | Radtke et al. | |
| 7,795,994 B2 | 9/2010 | Radtke | |
| 7,804,280 B2 | 9/2010 | Deaver, Sr. et al. | |
| 7,930,141 B2 | 4/2011 | Banting | |
| 8,421,444 B2 | 4/2013 | Gunn | |
| 8,497,781 B2 | 7/2013 | Engelhardt et al. | |
| 8,594,956 B2 | 11/2013 | Banting et al. | |
| 8,786,292 B2 | 7/2014 | Parsons | |
| 9,182,429 B2 | 11/2015 | Saxby et al. | |
| 9,229,036 B2 | 1/2016 | Kast et al. | |
| 9,448,257 B2 | 9/2016 | Saxby et al. | |
| 9,581,624 B2 | 2/2017 | Rostron et al. | |
| 9,954,354 B2 | 4/2018 | Baker et al. | |
| 9,970,968 B2 * | 5/2018 | Beekmann | G01R 23/02 |
| 9,984,818 B2 | 5/2018 | Rumrill | |
| 2002/0101231 A1 * | 8/2002 | Staats | G01R 21/1331 324/126 |
| 2004/0156154 A1 | 8/2004 | Lazarovich et al. | |
| 2005/0073200 A1 | 4/2005 | Divan et al. | |
| 2005/0273280 A1 * | 12/2005 | Cox | G01R 19/2513 702/60 |

(56) References Cited

U.S. PATENT DOCUMENTS

| | | | |
|---|---|---|---|
| 2008/0059088 A1* | 3/2008 | Atanackovic | G01R 21/1271 702/60 |
| 2008/0077336 A1* | 3/2008 | Fernandes | H02J 13/00006 702/65 |
| 2009/0058582 A1 | 3/2009 | Webb | |
| 2009/0309754 A1 | 12/2009 | Bou et al. | |
| 2010/0085036 A1 | 4/2010 | Banting et al. | |
| 2011/0032739 A1 | 2/2011 | Juhlin | |
| 2012/0039062 A1 | 2/2012 | McBee et al. | |
| 2012/0093240 A1* | 4/2012 | McFarland | H04B 3/54 375/257 |
| 2012/0139554 A1* | 6/2012 | Parsons | G01R 35/04 324/543 |
| 2012/0221265 A1* | 8/2012 | Arya | G01R 29/18 702/61 |
| 2012/0236611 A1 | 9/2012 | Alexandrov et al. | |
| 2013/0049732 A1* | 2/2013 | Kulkarni | G01R 29/18 324/66 |
| 2013/0064178 A1* | 3/2013 | Cs | H04Q 9/00 370/328 |
| 2013/0162136 A1 | 6/2013 | Baldwin et al. | |
| 2013/0314144 A1* | 11/2013 | Chang | G06F 3/0445 327/361 |
| 2014/0062221 A1 | 3/2014 | Papastergiou et al. | |
| 2014/0145858 A1 | 5/2014 | Miller et al. | |
| 2014/0174170 A1 | 6/2014 | Davis | |
| 2014/0192458 A1 | 7/2014 | Valdes | |
| 2014/0226366 A1 | 8/2014 | Morokuma et al. | |
| 2014/0260598 A1 | 9/2014 | Miller | |
| 2014/0343878 A1* | 11/2014 | Gudmundsson | G01R 19/2513 702/64 |
| 2015/0042806 A1* | 2/2015 | Wierich | G06T 5/70 348/148 |
| 2015/0198667 A1 | 7/2015 | Krekeler | |
| 2015/0378935 A1* | 12/2015 | Lin | G06F 12/121 711/159 |
| 2016/0116505 A1 | 4/2016 | Kast et al. | |
| 2016/0198245 A1* | 7/2016 | Rhoads | G01R 19/2513 340/870.02 |
| 2016/0239034 A1* | 8/2016 | Chan | H02J 13/00002 |
| 2016/0252562 A1* | 9/2016 | Biswas | G01R 31/088 324/764.01 |
| 2017/0184416 A1* | 6/2017 | Kohlenberg | G01D 3/08 |
| 2017/0199533 A1 | 7/2017 | McCollough | |
| 2017/0227592 A1* | 8/2017 | Berler | G01R 31/62 |
| 2018/0061214 A1* | 3/2018 | Vanchev | H04L 41/0659 |
| 2018/0143234 A1 | 5/2018 | Saxby | |
| 2021/0285994 A1* | 9/2021 | Yu | G05B 23/0254 |

FOREIGN PATENT DOCUMENTS

| | | |
|---|---|---|
| EP | 2340592 A | 7/2011 |
| EP | 2350764 A | 8/2011 |

OTHER PUBLICATIONS

Ted Hessing, 6σSTUDY Guide.com, Standard Deviation, 2017, downloaded from https://sixsigmastudyguide.com/standard-deviation/ downloaded on Dec. 6, 2021 (Year: 2017).*

Percentiles & z-scores—Texas Instruments, 2015, downloaded from https://education.ti.com > files > percentiles—zscores, downloaded May 3, 2022 (Year: 2015).*

NASPI Control Room Solutions Task Team Paper, "Using Synchrophasor Data for Phase Angle Monitoring," May 2016, NASPI, downloaded from https://www.naspi.org/sites/default/files/reference_documents/0.pdf on Aug. 2, 2022 (Year: 2016).*

NASPI Control Room Solutions Task Team Paper, "Using Synchrophasor Data for Phase Angle Monitoring," May 2016, downloaded from https://www.naspi.org/sites/default/files/reference_documents/0.pdf on Aug. 2, 2022 (Year: 2016).*

Chen et al.; Development of arc-guided protection devices against lightning breakage of covered conductors on distribution lines; IEEE Trans. Power Deliv.; 25(1): pp. 196-205; Jan. 2010.

Chen Yang Technologies; Split core hall effect dc current sensor CYHCT-C2TC; 4 pages; retrieved from the internet Jan. 5, 2015 (http://www.hallsensors.de/CYHCT-C2TC.pdf) (Product Information).

Saha et al.; Fault Location on Power Networks (Power Systems); Springer Verlag; London, UK; 435 pgs.; 2010 (Preface: Oct. 2009).

Shepard et al.; An overview of rogowski coil current sensing technology; 13 pages; retrieved from the internet Jan. 5, 2016 (http://www.dynamp.net/idadocum.nsf/c2270fbdd892ac3e86266e75000adBBa/e710af6d3e0f6255862565d7004b19db/$FILE/Report.pdf).

Stringfield et al.; Fault location methods for overhead lines; in Transactions of the American Institute of Electrical Engineers; Amer. Inst. of Electrical Eng.; New York, NY: Part. III: vol. 76; pp. 518-630; Aug. 1957.

Rumrill; U.S. Appl. No. 16/574,465 entitled "Systems and methods to measure primary voltage using capacitive coupled test point and grounded sensor circuit," filed Sep. 18, 2019.

Rumrill; U.S. Appl. No. 16/574,486 entitled "Distrubance detecting current sensor," filed Sep. 18, 2019.

Rumrill; U.S. Appl. No. 16/575,220 entitled "Systems and methods to maximize power from multiple power line energy harvesting devices," filed Sep. 18, 2019.

* cited by examiner

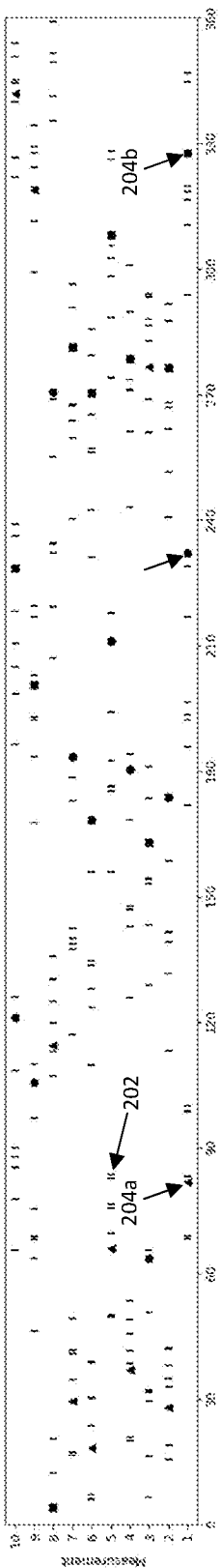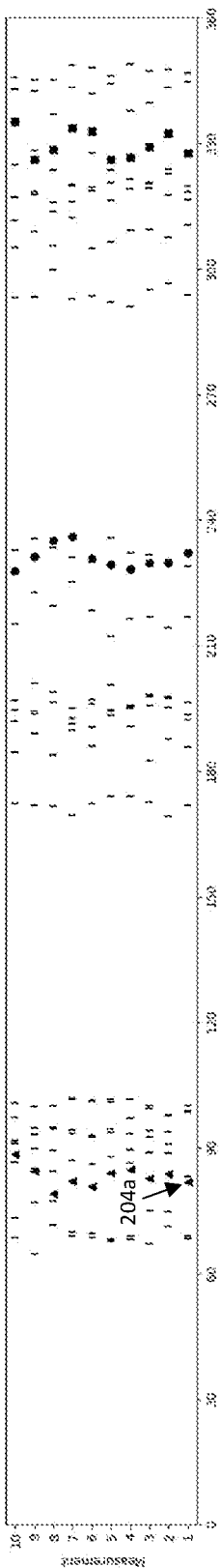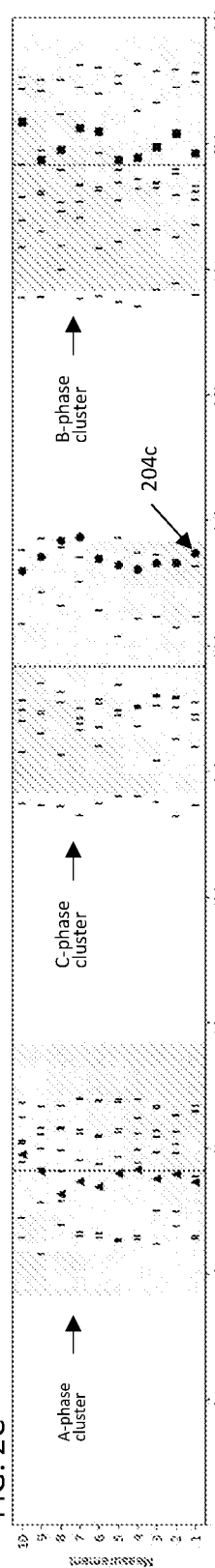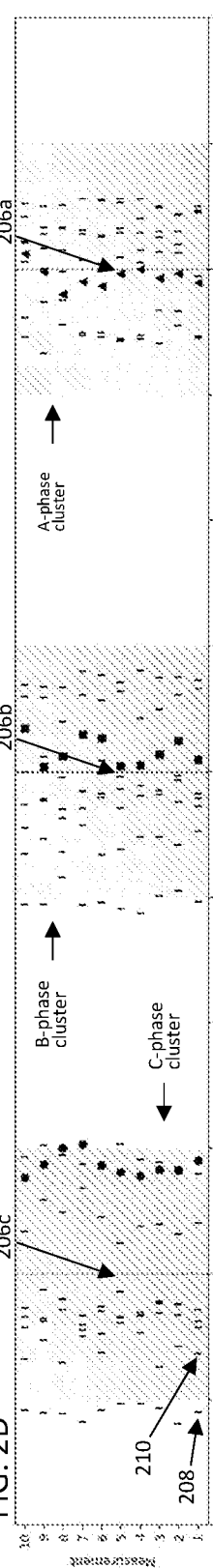
FIG. 2A
FIG. 2B
FIG. 2C
FIG. 2D

POWER LINE SENSORS WITH AUTOMATIC PHASE IDENTIFICATION

CROSS REFERENCE TO RELATED APPLICATIONS

This application claims the benefit of U.S. Provisional Patent Application No. 62/745,877, filed Oct. 15, 2018, titled "Power Line Sensors with Automatic Phase Identification", the contents of which are incorporated by reference herein.

INCORPORATION BY REFERENCE

All publications and patent applications mentioned in this specification are herein incorporated by reference to the same extent as if each individual publication or patent application was specifically and individually indicated to be incorporated by reference.

FIELD

The present application relates generally to distribution line monitoring, sensor monitoring, and sensing and identifying electrical characteristics of a power distribution line.

BACKGROUND

Utilities have various reasons for needing to know the conductor phase (A, B, or C) of a particular conductor in a distribution network. When adding a single-phase drop for a new customer, Utilities need to choose the phase appropriate for load balancing. When repairing or rerouting all three phases, they need to maintain the phase assignment, or at least the phase sequence. When analyzing faults or other phenomena, knowing conductor phase supports proper fusion of measurement data from disparate points along a feeder network. If a Utility would like to repair a single phase on a feeder while keeping the others active, then phase identification can be a safety issue.

A current approach to determining conductor phase uses GPS for a timing reference and measures voltage phase simultaneously at a reference and field location. The difference between these measurements provides the phase relationship between the reference and field locations.

US power grid frequencies are routinely more than 0.01 Hz away from their nominal 60 Hz. So using phase offset relative to the GPS second is only useful for measurements taken at very nearly the same time, since, for example, at 60.01 Hz, the voltage phase will slip a full 360 degrees every 100 seconds. Current techniques address this constraint by requiring a dedicated, precise, and highly-available reference station to support each field measurement.

Making accurate field measurements presents additional challenges. In disambiguating three phases, the error budget is ±60 degrees. Delta-wye transformers can introduce ±30 degrees of offset at the substation. E-field coupling can introduce up to 12 degrees of offset in an e-field-based voltage phase estimate. Internal transformer impedances can contribute up to ±5 degrees phase offset, with line impedances adding another 2-3 degrees of phase offset. Finally, speed-of-light propagation delay introduces an offset of one degree every 8.6 miles. A typical approach to mitigating these sources of uncertainty is to limit the distance between the reference and the location of the field measurement. This in turn requires the use of multiple references to support field measurements over a broad area.

SUMMARY

A method of collecting and characterizing phase measurements of a power network is provided, comprising receiving phase measurements from a plurality of line monitoring devices on the power network at a plurality of measurement intervals, normalizing the phase measurements for each of the plurality of line monitoring devices, grouping the plurality of line monitoring devices into a plurality of clusters representing each phase of the power network, and selecting one or more reference devices to characterize a conductor phase value of each of the plurality of clusters.

In some implementations, the method further comprises collecting phase measurements from the power network with the plurality of line monitoring devices. Collecting the phase measurements can comprise measuring an electric field of conductors of the power network, measuring a current of conductors of the power network, or measuring a voltage of conductors of the power network.

In some examples, normalizing the phase measurements comprises subtracting an average phase change of the plurality of line monitoring devices between each of the measurement intervals.

In one implementation, grouping the plurality of line monitoring devices comprises identifying cluster centers of the plurality of clusters.

In some examples, identifying the cluster centers comprises computing a sum of squares of differences between each phase measurement for each line monitoring device a potential cluster center value, and determining the cluster centers for which the sum of squares is the lowest.

In one implantation, the potential cluster center values comprise three potential cluster center values spaced 120 degrees apart.

In some examples, grouping the plurality of line monitoring devices further comprises assigning each line monitoring device to the cluster with a cluster center closest to the line monitoring devices phase measurements.

In one embodiment, the line monitoring device is assigned to the cluster if an angle difference between the line monitoring device and the cluster center is below a phase angle threshold. In some examples, the phase angle threshold comprises 30 degrees. Alternatively, the phase angle threshold comprises 45 degrees.

In one embodiment, the selecting step further comprises selecting a reference device with normalized measurements falling within the cluster with the smallest cluster center value, and assigning the cluster with the smallest cluster center value to be an A-phase cluster.

In some embodiments, the selecting step further comprises selecting a reference device with normalized measurements falling within the cluster with a central cluster center value, and assigning the cluster with the central cluster center value to be a C-phase cluster.

Alternatively, the selecting step further comprises selecting a reference device with normalized measurements falling within the cluster with the largest cluster center value, and assigning the cluster with the largest cluster center value to be a B-phase cluster.

A non-transitory computing device readable medium having instructions stored thereon is also provided, wherein the instructions are executable by a processor to cause a computing device to receive phase measurements from a plurality of line monitoring devices on the power network at a plurality of measurement intervals, normalize the phase measurements for each of the plurality of line monitoring devices, group the plurality of line monitoring devices into a plurality of clusters representing each phase of the power network, and select one or more reference devices to characterize a conductor phase value of each of the plurality of clusters.

A power line monitoring system is also provided, comprising a plurality of line monitoring devices configured to collect phase measurements for each phase of a power network over time, and a remote computing device configured to receive the phase measurements from the plurality of line monitoring devices, the remote computing device being configured to normalize the phase measurements for each of the plurality of line monitoring devices, group the plurality of line monitoring devices into a plurality of clusters representing each phase of the power network, and select one or more reference devices to characterize a conductor phase value of each of the plurality of clusters.

BRIEF DESCRIPTION OF THE DRAWINGS

The novel features of the invention are set forth with particularity in the claims that follow. A better understanding of the features and advantages of the present invention will be obtained by reference to the following detailed description that sets forth illustrative embodiments, in which the principles of the invention are utilized, and the accompanying drawings of which:

FIGS. 2A, 2B, 2C and 2D represent e-field phase angle measurements for a plurality of line monitoring over an extended period of time.

DETAILED DESCRIPTION

The approach generally described herein applies to fleets of potentially noisy, biased, and intermittently available GPS-enabled, electric field sensors deployed on power distribution lines. As will be described in more detail, devices and methods herein can be configured to measure and report to a server the phase of their respective surrounding electric field at regular, precisely-specified times. The server can be configured to receive and cluster the measurements and use devices with known phase attributes to characterize devices with unknown phase attributes.

Figure 1A:
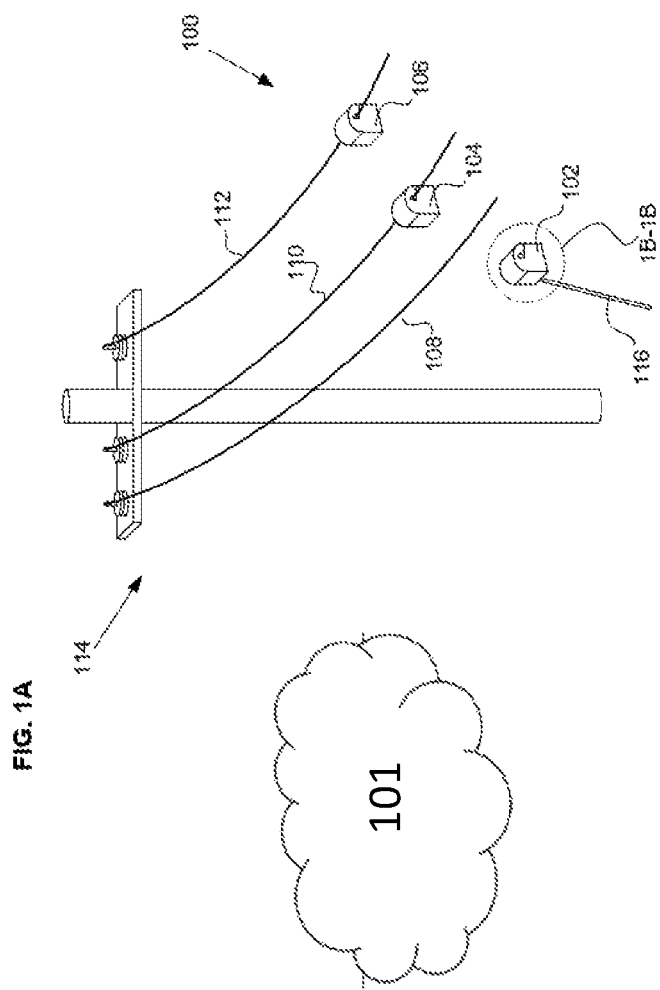
FIG. 1A is a typical over-head three-phase power distribution system utilizing a cross-bar mounted on pole for mechanical positioning of the conductors. Alternate patterns of parallel conductor routing are sometimes used. Power distribution line monitoring devices (102,104,106) are attached to the power lines typically using a standard lineman's shotgun hotstick (116) for easy deployment with necessitating turning off power in the lines.

Power line monitoring devices and systems described herein are configured to measure the currents and electric fields of power grid distribution networks. Referring to FIG. 1A, monitoring system 100 comprises monitoring devices 102, 104, and 106 mounted to power lines 108, 110, and 112, respectively, of power distribution network 114. The monitoring system 100 can further comprise a remote server 101 that can be configured to communicate with the monitoring devices wirelessly or by wire. The power distribution network can be a three phase AC network, or alternatively, a single-phase network, for example. The power distribution network can be any type of network, such as a 60 Hz North American network, or alternatively, a 50 Hz network such as is found in Europe and Asia, for example. Power distribution networks, such as in the United States, typically operate at a medium voltage (e.g., 4 kV to 65 kV or higher) to reduce the energy lost during transmission over long distances. The monitoring devices can also be used on high voltage "transmission lines" that operate at voltages higher than 65 kV.

The remote server 101 can comprise a computer readable media and is intended to represent a variety of potentially applicable technologies. For example, the remote server 101 can be used to form a network or part of a network. Where two components are co-located on a device, the remote server 101 can include a bus or other data conduit or plane. Where a first component is co-located on one device and a second component is located on a different device, the remote server 101 can include a wireless or wired back-end network or LAN. The computer-remote server 101 can also encompass a relevant portion of a WAN or other network, if applicable.

As used herein, any "systems" or "devices" may include one or more processors or a portion thereof. A portion of one or more processors can include some portion of hardware less than all of the hardware comprising any given one or more processors, such as a subset of registers, the portion of the processor dedicated to one or more threads of a multi-threaded processor, a time slice during which the processor is wholly or partially dedicated to carrying out part of the engine's functionality, or the like. As such, a first device and a second device can have one or more dedicated processors or a first device and a second device can share one or more processors with one another or other devices. Depending upon implementation-specific or other considerations, a device or system can be centralized or its functionality distributed. A system or device can include hardware, firmware, or software embodied in a computer-readable medium for execution by the processor. The processor transforms data into new data using implemented data structures and methods, such as is described with reference to the figures herein.

The systems or devices described herein, or the engines through which the systems and devices described herein can be implemented, can be cloud-based. As used herein, a cloud-based system or device can run applications and/or functionalities using a cloud-based computing system. All or portions of the applications and/or functionalities can be distributed across multiple computing devices, and need not be restricted to only one computing device. In some embodiments, the cloud-based systems or devices can execute functionalities and/or modules that end users access through a web browser or container application without having the functionalities and/or modules installed locally on the end-users' computing devices.

Figure 1C:
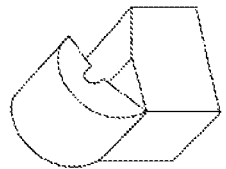
FIGS. 1B and 1C show a schematic representation of a monitoring sensor in the closed (1B) and open (1C) positions. The open position facilitates mounting the monitoring sensor on a power line. The sensor remains on the power line in the closed (1B) position.
Figure 1B:
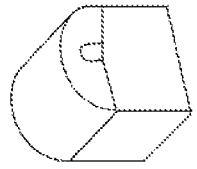

Monitoring devices 102, 104, and 106 can be mounted on each power line of a three-phase network, as shown, and can be configured to monitor, among other things, current flow in the power line, electric field(s) surrounding the power line, and/or voltage of the power line. In additional embodiments, multiple sensors can be used on a single phase line. The monitoring devices can be mounted quickly and easily via a hot-stick 116, and can harvest energy from the power lines for operation with or without additional supplemental power (e.g., include batteries or solar panels). The monitoring devices can further include wireless transmission and receiving capabilities for communication with a central server and for communications between each monitoring device. Installation of a three monitoring device array can be placed and configured by a single linesman with a hot-stick and a bucket truck in less than 20 minutes. Monitoring device communication with the installation crew can be enabled during the installation process to provide immediate verification of successful installation. FIG. 1B illustrates a monitoring device in a closed/clamped configuration, and FIG. 1C shows the monitoring device in an opened/installation configuration. It should be understood that the device is opened into the installation configuration during installation on power lines, then closed around the line in the clamped configuration prior to operation.

Furthermore, monitoring devices 102, 104, and 106 are configured to record and analyze event/fault signatures, and to classify event waveforms. Current and electric field waveform signatures can be monitored and catalogued by the monitoring devices to build a comprehensive database of events, causes, and remedial actions. In some embodiments, an application executed on a central server can provide waveform and event signature cataloguing and profiling for access by the monitoring devices and by utility companies. This system can provide fault localization information with remedial action recommendations to utility companies, pre-emptive equipment failure alerts, and assist in power quality management of the distribution grid.

Monitoring devices 102, 104, and 106 can comprise sensing elements, a power supply, a battery, a microprocessor board, and high-powered communication systems (not shown) disposed within a robust mechanical housing designed for severe service conditions. The monitoring devices are configured to withstand temperatures ranging from −40 to +85 C, EMI and ESD immunity, current and voltage impulse resistance, driving rain and precipitation and salt fog survival. A typical embodiment of the monitoring devices is configured to operate continuously on power lines carrying up to 800 $A_{RMS}$ operating current with full functionality. Full functionality is also maintained during line fault current events up to 10 $kA_{RMS}$ and of limited time duration.

The monitoring devices can be configured to communicate wirelessly through a distribution network to the power utilities sensor control and distribution automation (SCADA) system. In some embodiments, the monitoring devices operate at differing powers with a custom designed omni-directional antenna. When mounted to typical power grid distribution networks, the monitoring devices are located approximately 30 feet above ground level and typically above tree tops, providing for a very substantial effective range of communication. In addition to two-way network communications for data packets and setting operational setpoints, the monitoring devices can be configured for wireless device firmware upgrades for long term functionality.

The monitoring devices described herein can also include power harvesting systems configured to convert the changing magnetic field surrounding the distribution lines into current and/or voltage that can be rectified into DC current and used to power the monitoring devices.

The present disclosure provides an approach to monitoring power distribution networks with a plurality of line monitoring devices, as illustrated in FIG. 1A, that eliminates the need for dedicated reference stations and provides support for noisy, biased, and intermittently available sensors.

FIGS. 2A-2D illustrate the consolidation of e-field phase angle measurements for a plurality of monitoring devices over a period of time. Referring to FIG. 2A, the y-axis represents a regular time interval upon which phase measurements are taking by the plurality of monitoring devices, and the x-axis includes plots of individual phase measurements 202 taken for a plurality of devices across a power grid network. For example, measurement set 1 could represent phase measurements taken simultaneously across the fleet of monitoring devices on day 1, measurement set 2 could represent measurements taken simultaneously on day 2, etc. Alternatively, in some embodiments, multiple simultaneous measurements across a fleet of devices are taken every day (e.g., measurements every 6 hours), so measurement set 1 could represent measurements taken at 12 am on day 1, measurement set 2 could represent measurements taken at 6 am on day 1, etc.

The measurements of three specific devices are illustrated in FIG. 2A along measurement "1" as reference 204a (triangle), reference 204c (circle) and reference 204b (square). It should be understood that the triangle, circle, and square references in the illustration are purely to aid in description and not intended to convey any additional information about the type of device or the phase of the conductor upon which that device is placed. The plot in FIG. 2A shows how the phase measurements for each of the reference devices changes over time as more measurements are taken and plotted along the y-axis. For example, the initial phase measurement of reference 204a (measurement 1) was approximately 85 degrees, but the phase measurement of reference 204a at measurement 4 is approximately 40 degrees. The various measurements are uncorrelated because of the grid frequency instability and the time elapsed between measurements.

Over time, the system is configured to measure how much the phase measurement changes from one measurement to the next at each measuring device, since this will be the same (plus system variability and measurement noise) across measuring devices. Taking the average of this phase change and subtracting it from each new measurement yields an updated new measurement that is directly comparable to the previous measurement and whose variance reflects the system variability and measurement noise at that device and at that time. Because the series of updated measurements at each measuring device are comparable to each other, they can be combined over time to produce useful statistics like mean and standard deviation. The mean can provide a more accurate estimate, and the standard deviation can reflect the confidence in that measurement. Thus, measurements across time are normalized by subtracting out the grid-wide phase change so that measurements taken at different times are still comparable.

FIG. 2B illustrates this normalization; all the phase measurements of the monitoring devices haven been normalized by subtracting the average phase change between each of the measurements. The normalization allows the system to provide information on how single devices are performing over time. For example, referring still to FIG. 2B, it can be seen than device 204a consistently provides phase measurements within approximately 5 degrees of 85 degrees. It should be noted in this example that the phase measurement of device 204a in FIG. 2B has the same value as the phase measurement of device 204a in FIG. 2A, since that device and measurement interval were used as the initial baseline to which subsequent measurements were normalized. All the other measurements across the other monitoring devices have been adjusted to minimize the phase offset from that initial measurement set.

The normalized phase measurements over time can provide a number of useful features for a line monitoring system. For example, the phase measurements can be used to characterize the noise levels of individual devices. Devices which become too inaccurate or noisy can be flagged and removed from service. The system can also average noise over time and reduce it just by averaging. Additionally, the phase measurements can be used to provide a property of the actual physical topology of the power distribution grid. For example, in many situations, a power company may not know physically which line is which along all sections of a power grid. For example, maintenance work or storms can result in sections of lines getting knocked down and replaced in the wrong physical location (e.g., a fallen phase A conductor line could be physically placed where the phase B conductor line was formerly located, and vis versa).

Once device phase measurements have been normalized and averaged over time, the system optimally partitions these averaged, normalized measurements into clusters corresponding to the phases of the power network. For example, on a three-phase network, the system would partition the normalized measurements into three clusters whose centers are 120 degrees apart. FIG. 2C illustrates this clustering for the normalized measurements of FIG. 2B. Here the cluster centers are at 85, 205, and 325 degrees. Finding the appropriate cluster centers is straightforward. Conceptually, it amounts to examining all possible choices with an acceptable resolution (e.g., 0/120/240, 1/121/241, 2/122/242, etc.) and for each computing a score: the sum of the squares of the differences between each measurement and its closest candidate cluster center. The desired partition is the one yielding the lowest score.

Once clustering is obtained, each device phase measurement can be assigned to a cluster according to the cluster center it is closest to (e.g., a monitoring device with a phase measurement of 30 degrees is closer to a cluster center at 60 degrees than it is to a cluster center at 300 degrees). The angle difference between a cluster center and a monitoring device that will be grouped or accepted into that cluster center can be configurable. For example, the system may initially be set with an angle difference threshold for clustering set at 45 degrees. Under this example, other monitoring devices that provide an average, normalized phase angle within 45 degrees of a cluster center at a specific measurement interval can be assigned to be within the same cluster.

The normalization and averaging of phase measurements produces useful information as described above, but to assign actual conductor phase values (A, B, or C) to each device, the system relies on the selection of at least one of the plurality of monitoring devices to serve as an initial reference. As described herein, "system" can generally refer to the entire system used to measure, characterize, and analyze information measured from the power grid network, including a plurality of line monitoring devices, and optionally a remote server or database that collects and analyzes the measurements from the monitoring devices. In some embodiments, however, three is no remote server or database, but instead one or more of the monitoring devices takes on a "master" role responsible for collecting and analyzing the measurements across the fleet. In some embodiments, at least one monitoring device can be set as a reference device for each of the conductors of the power distribution network (e.g., at least one reference device for each of conductors A, B, C on the three-phase network). This initial reference device can be used initially to characterize the plurality of monitoring devices, but is not given any special consideration beyond that point. The first time at which sufficient device phase measurements are available and can be clustered into three phase groups, and at which the reference device has an available measurement, that reference measurement is used to assign conductor labels A, B, and C to those clusters. After that point, the average of future, available phase measurements for those identified devices form a virtual reference that can be used to characterize additional devices as their measurements become available.

FIG. 2C illustrates how the selection of a device as a reference is used to characterize the conductor phase of each cluster. Here the device 204c whose normalized measurements are marked as solid circles is selected as a C-phase device. Because its averaged, normalized measurements fall within the middle cluster, this cluster is therefore determined to be C-phase. Thus all devices whose averaged, normalized measurements are in the middle cluster are identified as C-phase as well. Assuming the power grid follows a clockwise convention for defining conductor phase letters, then the other clusters and their associated devices can also be identified as shown in FIG. 2C. The figure shows the C-phase reference device contributing measurements to every measurement set in this example, but note that, once the clusters are identified, the C-phase reference device measurements are no longer required. Thus, the system is robust against the dropout, relocation, or removal of this particular device.

Measurements can be normalized to a range of 0-360 degrees. For example, this can be accomplished by subtracting or adding multiples of 360 to the measurements until the result falls in the range 0 (inclusive) to 360 (exclusive). For presentation, and conceptually, in one embodiment it may be useful to shift the updated, normalized phase measurements (which are fairly stable over time) by the amount necessary so that the A cluster corresponds to 300, the B cluster to 180, and the C cluster to 60, as shown in FIG. 2D.

In general, as illustrated by FIG. 2C, the three clusters will not line up perfectly relative to 60/180/300, since the first measurement set is arbitrary. This is analogous to the arbitrariness of a potential field in physics: only differences have real meaning. FIG. 2D illustrates a final rotation of the data set which is just a conceptual convenience to align the clusters with conventional labeling (e.g., cluster centers at 60 degrees, 180 degrees, and 300 degrees) and can be applied after the initial reference measurement is used to assign letters A/B/C to the clusters. The average distance from each original cluster to the desired, new cluster center (C=60, B=180, A=300) can be computed, and then shifted appropriately to arrive at the more natural presentation shown in FIG. 2D. Lines 206c, 206b, and 206a are positioned at phase measurements of 60, 180, and 300 corresponding generally to conductors C, B, and A respectively in a three-phase power network. It should be understood that the C, B, and A conductors positioned at phase angles of 60, 180, and 300 generically describes one three-phase topology that is commonly in use, but other naming conventions or phase angles may be used for each of the conductors in some power distribution networks. For example, different conductors could be assigned to the illustrated phase values.

Once a set of cluster centers exists at one measurement interval, the next normalized measurements of the devices in each cluster are used to determine the clustering for the next measurement interval, and the cluster centers are adjusted in order to again minimize the sum of the squares of the angle differences between clustered devices and their cluster centers. Once a set of cluster centers exists, two devices are in the same cluster if they are within a configurable distance (e.g., 30 degrees) from the same cluster center.

When comparing a field phase measurement with a cluster center, some margin is required to accommodate the sources of error mentioned earlier. For example, a field measurement might be accepted if it differs by at most 30 degrees from one of the three cluster centers. The actual value for which a measurement is accepted is configurable for a system. If the angle difference between a device and the nearest cluster center (which serves as the virtual reference) is greater than this configurable value, then the system marks the device phase as unknown due to ambiguous phase angle. This is useful information, since it may indicate a hardware problem, or an environment where an electric field reading is too noisy to make a determination. The device producing the measurement 208 in FIG. 2D is an example.

With the approach presented here, two devices are assigned the same phase if they belong to the same cluster. Using a margin of ±30 degrees, a target and reference could differ by 60 degrees and still support a phase determination. For example, in FIG. 2D, the device with measurement 210 can be identified as C-phase, even though the reference device has phase measurements that are significantly more than 30 degrees away.

The technique and system presented herein collects and clusters periodic measurements across a fleet of monitoring devices, and it does it in such a way that the series of measurements for a given device are comparable to each other. As a result, multiple noisy measurements for a device can be combined to produce an improved estimate of the device's phase.

With conventional approaches, a reference device must always be available. With the approach presented here, it is sufficient that a reference device submit a measurement that can be used to characterize the clusters formed by the other devices in the fleet. After this point, the fleet effectively provides its own reference. Even if the original reference device is no longer available, new devices can still be characterized according to the cluster they fall into.

Figure 3:
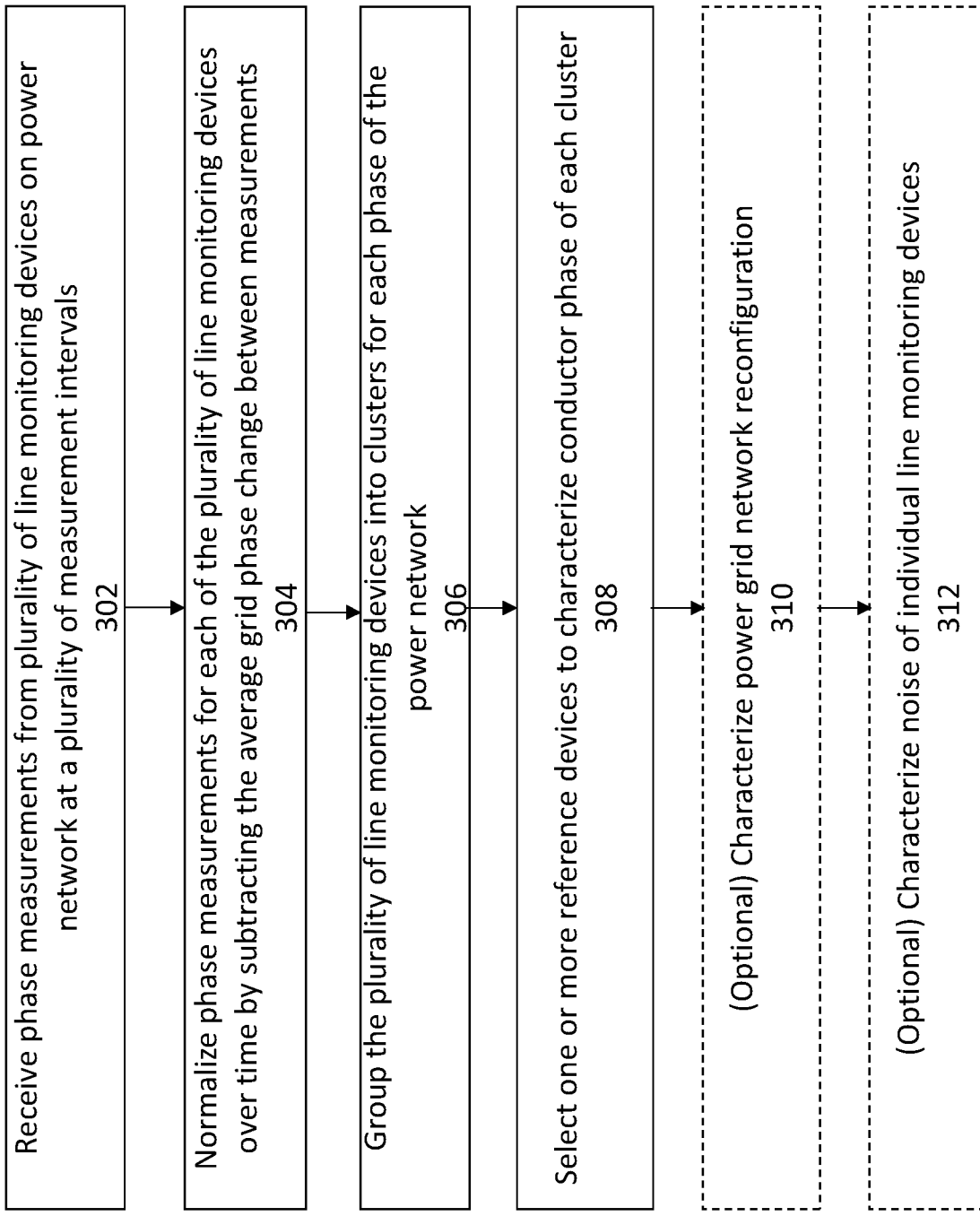
FIG. 3 is a flowchart describing one example of collecting and characterizing phase measurements of a power grid over time.

FIG. 3 illustrates one example of a method for collecting and characterizing phase measurements of a power grid over time with a plurality of line monitoring devices. This method may be automatically implemented by a system, such as one or more of the systems described above. At an operation 302, the method can include receiving phase measurements from a plurality of line monitoring devices on a power network at a plurality of measurement intervals. As described above, a power network can comprise a three-phase power network with conductors A, B, and C generally separated in phase by 120 degrees. A plurality of line monitoring devices can be mounted on each of the conductors in the power network at various locations along the conductors. It should be understood that multiple line monitoring devices can be located at various points along each conductor. The line monitoring devices can be configured to measure electrical parameters of the conductors at each device location (e.g., electric field, current, etc.).

In some implementations, the line monitoring devices can collect the phase measurements from the power network at each of a plurality of measurement intervals. The measurements can be collected, for example, by measuring the electric field, current, and/or voltage of each conductor of the power network and computing or identifying the phase angle. In one example, the phase measurements can be transmitted by the plurality of line monitoring devices to a remote server or computing system for further analysis and storage.

At an operation 304, the phase measurements of each of the line monitoring devices can be normalized over time. This normalization can comprise, for example, subtracting the average grid phase change of all line monitoring devices on the power network between each of the measurement intervals. This provides an updated new measurement that is directly comparable to the previous measurement and whose variance reflects the system variability and measurement noise at that device and at that time. Because the series of updated measurements at each measuring device are comparable to each other, they can be combined over time to produce useful statistics like mean and standard deviation.

At an operation 306, the system can group the plurality of line monitoring devices into clusters of devices for each phase of the power network. Thus, a three-phase power network will result in the devices being grouped into three clusters. In one implementation, the system can be configured to use the multiple measurement sets from the measurement intervals to compute averages of the normalized phase measurements for each device. The system can then group the devices into clusters based on the averages of the normalized phase measurements for each device. This can be done, for example, without the use of reference devices. In one implementation, the system groups the devices into clusters by examining all possible choices with an acceptable resolution (e.g., 0/120/240, 1/121/241, 2/122/242, etc.) and for each potential resolution computing a score. The score can be determined by calculating the sum of the squares of the differences between each measurement and its closest candidate cluster center. The desired partition is the one yielding the lowest score.

At an operation 308, one or more reference devices can be selected to characterize the conductor phase of each cluster of devices. In one example, the devices with normalized measurements falling within the smallest phase angle cluster (e.g., the left-most cluster in FIG. 2C) can be characterized as A-phase, devices with normalized measurements falling within the middle phase angle cluster (e.g., the middle cluster in FIG. 2C) can be characterized as C-phase, and devices with normalized measurements falling within the largest phase angle cluster (e.g., the right-most cluster in FIG. 2C) can be characterized B-phase.

In one embodiment, line monitoring devices with a phase measurement within a predetermined proximity to a phase measurement cluster center can be clustered into that group. For example, if a cluster center is 90 degrees, any other line monitoring devices with a phase angle measurement within 30 degrees (or some other predetermined value, e.g., 45 degrees) of that cluster center can be grouped in with that cluster. If one of the devices in a cluster is a reference with a known phase, then all devices in that cluster share that phase. The result of operation 308 generally results in three groups of line monitoring devices generally associated with each of the phases of the power network (e.g., phases A, B, and C).

Once the phase measurements of the fleet of line monitoring devices has been normalized and characterized, the system can provide interesting and useful information and metrics about the power network generally, and also about the individual line monitoring devices. For example, at an operation 310, the system can optionally characterize the power grid network reconfiguration. These normalized phase measurements can be used to determine, for example, if the phase measurements across the network as a whole have changed in a substantial manner, and can be used to indicate problems or issues with the power grid, such as an unintended subnetwork reconfiguration. Similarly, at an operation 312, the system can optionally characterize the performance of individual line monitoring devices. Normalized phase measurements of a single device can be compared to the fleet of devices as a whole to determine if a single device is producing inaccurate or noisy phase angle measurements. Devices that aren't working properly or are noisier than the fleet can be identified, flagged, and removed from service or repaired.

As for additional details pertinent to the present invention, materials and manufacturing techniques may be employed as within the level of those with skill in the relevant art. The same may hold true with respect to method-based aspects of the invention in terms of additional acts commonly or logically employed. Also, it is contemplated that any optional feature of the inventive variations described may be set forth and claimed independently, or in combination with any one or more of the features described herein. Likewise, reference to a singular item, includes the possibility that there are plural of the same items present. More specifically, as used herein and in the appended claims, the singular forms "a," "and," "said," and "the" include plural referents unless the context clearly dictates otherwise. It is further noted that the claims may be drafted to exclude any optional element. As such, this statement is intended to serve as antecedent basis for use of such exclusive terminology as "solely," "only" and the like in connection with the recitation of claim elements, or use of a "negative" limitation. Unless defined otherwise herein, all technical and scientific terms used herein have the same meaning as commonly understood by one of ordinary skill in the art to which this invention belongs. The breadth of the present invention is not to be limited by the subject specification, but rather only by the plain meaning of the claim terms employed.

What is claimed is:

1. A method of collecting and characterizing phase-angle measurements of a power network, comprising:
    attaching a plurality of line monitoring devices to a plurality of conductors of the power network, the plurality of conductors corresponding to a plurality of different conductor phases used in the power network;
    receiving a plurality of first phase-angle measurements, individual ones of the first phase-angle measurements being received from a respective one of the plurality of line monitoring devices on the power network, the plurality of first phase-angle measurements corresponding to measurements of the plurality of different conductor phases of the plurality of conductors;
    normalizing the plurality of first phase-angle measurements to yield normalized phase-angle measurements associated with individual ones of the plurality of line monitoring devices by:
    determining a plurality of phase-angle changes, each of the plurality of phase-angle changes being respectively determined for a different respective line monitoring device of the plurality of line monitoring devices, the individual ones of the plurality of phase-angle changes being a difference between two subsequent phase-angle measurements from the respective different line monitoring device,
    calculating a phase-angle change average as an average of the plurality of phase-angle changes, and
    subtracting the phase-angle change average from each of the first phase-angle measurements;
    identifying a respective conductor phase of the power network monitored by the individual ones of the plurality of line monitoring devices based at least in part on the normalized phase-angle measurements; and
    monitoring the power network using the normalized phase-angle measurements, wherein monitoring the power network includes one or both of (1) flagging, and (2) removing, ones of the plurality of line monitoring devices determined to be noisy.

2. The method of claim 1, further comprising collecting the plurality of first phase-angle measurements from the power network with the plurality of line monitoring devices.

3. The method of claim 2, wherein collecting the plurality of first phase-angle measurements comprises measuring an electric field of conductors of the power network.

4. The method of claim 2, wherein collecting the plurality of first phase-angle measurements comprises measuring a current of conductors of the power network.

5. The method of claim 2, wherein collecting the plurality of first phase-angle measurements comprises measuring a voltage of conductors of the power network.

6. The method of claim 1, further comprising normalizing received phase-angle measurements over time by comparing additional phase-angle measurements from the individual ones of the plurality of line monitoring devices with a corresponding previous normalized phase-angle measurement.

7. The method of claim 1, wherein identifying the respective conductor phase of the power network further comprises grouping the plurality of line monitoring devices by identifying cluster centers of a plurality of clusters.

8. The method of claim 7, wherein identifying the cluster centers comprises:
    for individual ones of a plurality of candidate cluster center values, computing a sum of squares of differences between individual ones of the normalized phase-angle measurements and a respective one of a plurality of potential cluster center values; and
    determining the cluster centers for which the sum of squares is lowest.

9. The method of claim 8, wherein the plurality of potential cluster center values comprise three potential cluster center values spaced 120 degrees apart.

10. The method of claim 1, wherein identifying the respective conductor phase of the power network further comprises grouping the plurality of line monitoring devices by assigning the individual ones of the plurality of line monitoring devices to a respective cluster of a plurality of clusters with a respective cluster center closest to the normalized phase-angle measurements of the individual ones of the plurality of line monitoring devices.

11. The method of claim 10, wherein the individual ones of the plurality of line monitoring devices are assigned to the respective cluster of the plurality of clusters in response to determining that an angle difference between the normalized phase-angle measurement corresponding to the individual ones of the plurality of line monitoring devices and the respective cluster center is below a phase-angle threshold.

12. The method of claim 11, wherein the phase-angle threshold comprises 30 degrees.

13. The method of claim 11, wherein the phase-angle threshold comprises 45 degrees.

14. The method of claim 1, wherein identifying the respective conductor phase of the power network further comprises:
    selecting an A-phase reference device as one of the plurality of line monitoring devices with a corresponding normalized phase-angle measurement falling within a respective cluster of a plurality of clusters; and
assigning the respective cluster to be an A-phase cluster.

15. The method of claim 1, wherein identifying the respective conductor phase of the power network further comprises:
selecting a C-phase reference device as one of the plurality of line monitoring devices with a corresponding normalized phase-angle measurement falling within a respective cluster of a plurality of clusters with a central cluster center value; and
assigning the respective cluster with the central cluster center value to be a C-phase cluster.

16. The method of claim 1, wherein identifying the respective conductor phase of the power network further comprises:
selecting a B-phase reference device as one of the plurality of line monitoring devices with a corresponding normalized phase-angle measurement falling within a respective cluster of a plurality of clusters with a largest cluster center value; and
assigning the respective cluster with the largest cluster center value to be a B-phase cluster.

17. The method of claim 1, wherein identifying the respective conductor phase of the power network further comprises:
grouping the plurality of line monitoring devices into a plurality of clusters representing individual phases of a plurality of phases of the power network; and
selecting, from the plurality of line monitoring devices and for individual ones of the plurality of clusters, one or more reference devices to characterize a conductor phase value of the individual ones of the plurality of clusters.

18. The method of claim 1, further comprising calculating one or both of a mean and a standard deviation of the normalized phase-angle measurements over time for individual ones of the plurality of line monitoring devices.

19. The method of claim 1, wherein identifying the respective conductor phase of the power network further comprises:
setting one of the plurality of line monitoring devices as a reference device having a previously set phase characterization;
identifying a respective cluster of a plurality of clusters of the plurality of line monitoring devices based at least in part on the normalized phase-angle measurements; and
characterizing the respective cluster as monitoring the respective conductor phase based at least in part on previously set phase characterization.

20. The method of claim 19, further comprising:
after said characterizing, receiving an additional phase-angle measurement from an additional line monitoring device different than the plurality of line monitoring devices; and
characterizing the additional line monitoring device as monitoring the respective conductor phase based at least in part on the respective cluster when the additional phase-angle measurement, or a normalized additional phase-angle measurement based at least in part on the additional phase-angle measurement, corresponds to the respective cluster.

21. A non-transitory computing device readable medium having instructions stored thereon, wherein the instructions are executable by a processor to cause a computing device to perform a method comprising:
receiving a plurality of first phase-angle measurements, individual ones of the first phase-angle measurements being received from a respective one of a plurality of line monitoring devices on a power network, the plurality of line monitoring devices being coupled to a plurality of conductors of the power network, the plurality of conductors corresponding to a plurality of different conductor phases used in the power network, the plurality of first phase-angle measurements corresponding to measurements of the plurality of different conductor phases of the plurality of conductors;
normalizing the plurality of first phase-angle measurements to yield normalized phase-angle measurements associated with individual ones of the plurality of line monitoring devices by:
determining a plurality of phase-angle changes, each of the plurality of phase-angle changes being respectively determined for a different respective line monitoring device of the plurality of line monitoring devices, the individual ones of the plurality of phase-angle changes being a difference between two subsequent phase-angle measurements from the respective different line monitoring device,
calculating a phase-angle change average as an average of the plurality of phase-angle changes, and
subtracting the phase-angle change average from each of the first phase-angle measurements each first phase-angle measurement;
identifying a respective conductor phase of the power network monitored by the individual ones of the plurality of line monitoring devices based at least in part on the normalized phase-angle measurements; and
monitoring the power network using the normalized phase-angle measurements, wherein monitoring the power network including includes one or both of (1) flagging, and (2) removing, ones of the plurality of line monitoring devices determined to be noisy.

22. A power line monitoring system, comprising:
a plurality of line monitoring devices coupled to a plurality of conductors of a power network, the plurality of conductors corresponding to a plurality of different conductor phases used in the power network, the plurality of line monitoring devices being configured to collect phase-angle measurements for a respective conductor phase of a plurality of different conductor phases of the power network over time; and
a remote computing device configured to receive the phase-angle measurements from the plurality of line monitoring devices, the remote computing device being configured to:
normalize first phase-angle measurements of the phase-angle measurements to yield normalized phase-angle measurements associated with individual ones of the plurality of line monitoring devices by:
determining a plurality of phase-angle changes, each of the plurality of phase-angle changes being respectively determined for a different respective line monitoring device of the plurality of line monitoring devices, the individual ones of the plurality of phase-angle changes being a difference between two subsequent phase-angle measurements from the different respective line monitoring device,
calculating a phase-angle change average as an average of the plurality of phase-angle changes, and
subtracting the phase-angle change average from each of the first phase-angle measurements;

identify the respective conductor phase of the power network monitored by the individual ones of the plurality of line monitoring devices based at least in part on the normalized phase-angle measurements; and monitor the power network using the normalized phase-angle measurements, wherein monitoring the power network includes one or both of (1) flagging, and (2) removing, ones of the plurality of line monitoring devices determined to be noisy.

* * * * *